United States Patent
Swamy

[11] Patent Number: 5,571,608
[45] Date of Patent: Nov. 5, 1996

[54] APPARATUS AND METHOD OF MAKING LAMINATE AN EMBEDDED CONDUCTIVE LAYER

[75] Inventor: N. Deepak Swamy, Austin, Tex.

[73] Assignee: Dell USA, L.P., Austin, Tex.

[21] Appl. No.: 523,567

[22] Filed: Sep. 5, 1995

Related U.S. Application Data

[63] Continuation of Ser. No. 276,003, Jul. 15, 1994, abandoned.

[51] Int. Cl.$^6$ ............................................. B52B 9/00
[52] U.S. Cl. ..................... 428/246; 428/273; 428/320.2; 428/344; 428/137; 428/477.7; 428/209; 174/255; 174/256; 361/746
[58] Field of Search ................................... 428/209, 273, 428/320.2, 344, 137, 477.7; 361/746; 124/255, 256

[56] References Cited

U.S. PATENT DOCUMENTS

| | | | |
|---|---|---|---|
| 4,201,616 | 5/1980 | Chellis et al. | 428/901 |
| 4,563,385 | 1/1986 | Bhatt et al. | 428/901 |
| 4,662,973 | 5/1987 | Gotou et al. | 428/901 |
| 4,714,653 | 12/1987 | Cassat | 428/901 |
| 4,857,381 | 8/1989 | Suzuki | 428/901 |
| 4,937,132 | 6/1990 | Gaku et al. | 428/901 |
| 5,071,701 | 12/1991 | Tenney et al. | 428/901 |

*Primary Examiner*—Patrick Ryan
*Assistant Examiner*—Cathy K. Lee
*Attorney, Agent, or Firm*—Henry N. Garrana; Mark P. Kahler; Michelle M. Turner

[57] ABSTRACT

An embedded core laminate including a conductive reference plane interposed between two insulation layers, and further interposed between two conductive layers. The assembly is laminated using standard temperature and pressure laminating procedures. Holes for interconnect vias are preferably drilled into the reference plane before laminating. The resulting embedded core laminate has three conductive layers with relatively uniform separation, insuring improved impedance control on each PCB (printed circuit board). Since uniform separation is maintained from one PCB to another, multiple PCBs connected together using embedded core laminates according to the present invention allows minimum cross-talk and characteristic impedance variations from one PCB to the next. The material comprising the conductive layers are preferably chosen with a CTE to match that of semiconductor die to protect solder joints of mounted components from thermal stress, improving reliability of SMT devices and allowing direct chip attach methods to be implemented. Balanced PCBs having five, seven and other odd numbers of conductive layers are available using an embedded core laminate material according to the present invention.

14 Claims, 3 Drawing Sheets

APPARATUS AND METHOD OF MAKING LAMINATE AN EMBEDDED CONDUCTIVE LAYER

This application is a continuation of application Ser. No. 08/276,003, filed Jul. 15, 1994, now abandoned.

FIELD OF THE INVENTION

The present invention relates to printed circuit boards, and more particularly to a laminate material having an embedded conductive layer used in fabricating printed circuit boards.

DESCRIPTION OF THE RELATED ART

Personal computer technology is continually advancing to meet the growing needs of consumers and businesses. As market demands increase, computer designers are continually implementing new ways to achieve higher density semiconductor devices which operate at higher frequencies. Semiconductor devices or dies are typically mounted directly or indirectly to printed circuit boards (PCB) or printed wiring boards (PWB) using a variety of mounting techniques. The PCB provides electrical power and conductive pathways for communication between the various devices. PCB technology is also being improved to appropriately take advantage of the faster and more complex semiconductor devices.

A PCB is generally a custom device including a plurality of conductive and insulating layers sandwiched together. FIG. 1A shows a standard laminate material 100 used in most PCBs, which comprises a flat, rigid material constructed with an insulating layer 102 placed between two conductive metal sheets or layers 104a, 104b. The insulating layer is preferably a fiberglass sheet or other dielectric material for electrically isolating the conductive layers and for providing structural strength for mounting components. The fiberglass sheet is preferably impregnated with resin or epoxy, which is a family of thermosetting resins used to form a chemical bond with metal. The conductive layers are typically made of copper foil, which are laminated to the insulation layer using heat and pressure. The copper foil is etched to form signal traces providing the conductive pathways for the electrical signals. Holes or interconnect vias are usually drilled or punched to provide a conductive path between certain traces on different layers.

Although single layer boards exist, most PCBs today are multilayer boards (MLB) having the components mounted on one or both sides. If more than two layers are required, a four layer board may be fabricated by placing one or more layers of prepreg material 110 and layers of copper foil 106, 108 on either side of the laminate as shown in FIG. 1B. Additional layers can be added in a similar manner. Prepreg material is a sheet material such as glass fabric impregnated with a resin cured to an intermediate stage. An alternative method for fabricating a four layer board is to separate a couple of standard two layer laminates with prepreg material, as shown in FIG. 1C. This form is not as common because two layers of laminate material are relatively expensive. It is therefore common in the industry to fabricate PCBs having two, four, six or more even numbers of layers by adding pairs of layers in a similar manner as that shown in FIG. 1B.

There are several problems with standard two-layer laminate. The most common laminating procedure involves applying heat while pressing the conductive and the insulating layers together. Because of the pressure used in the laminating procedure, the two conductive layers of the laminate material may be placed relatively close together. However, two layers are usually insufficient in modern PCB applications, so that more layers must be added. The additional layers are typically added with a different process so that substantial thickness variations of the additional insulation occurs, resulting in variations in distance between the conductive layers. These variations in the thickness of the insulating layer cause mechanical property variations, which directly affect the electrical properties of the trace, such as characteristic impedance. As the frequency content and density of the signals increase and as electronic packaging decreases, the characteristic impedance of the signal traces becomes an important parameter. Variations in the separation between conductive layers causes corresponding characteristic impedance variations, which compromises signal integrity. This problem is exacerbated when several PCBs are manufactured by different vendors causing wide mechanical and electrical variations from board to board.

Materials used to manufacture standard laminates typically have a different coefficient of thermal expansion (CTE) than the die used to manufacture semiconductor chips. Such CTE variances decrease the reliability of the PCB because of thermal stress to solder joints of conventional surface mount technology (SMT) devices. Furthermore, direct chip attach (DCA) methods, where a semiconductor chip die is directly mounted to the PCB, are usually not attempted with PCBs designed with standard laminate materials because of the CTE differential. DCA methods are available only in specialized designs using exotic and expensive dielectric materials.

The flexibility of design is relatively limited with current PCB fabrication. If a typical four-layer board using two signal layers is insufficient due to routing density, the designer is forced to move to a six-layer board with four routing layers. Similarly, a designer must move to eight layers if six is insufficient, and so on. Simply adding a single layer to one side of a standard laminate is not practicable. Standard laminate is made with a different process than the process used to laminate the outer layers of an MLB, so that adding a layer on one side would expose the laminate to the different process. In particular, the thermoset resin of standard laminate is preset using a different process and should not be exposed to the heat and chemical process used to fabricate MLBs. Even if one layer is added without exposing the board to another process, a layer added only on one side results in an unbalanced board, which dramatically decreases the reliability of the PCB. An unbalanced board tends to bow or warp, resulting in undue stress on the solder joints of mounted components as well as undue stress on the PCB material and signal traces. Further, such a bowed board will not easily fit into standard slots or mounting flames.

It is therefore desirable to provide a new laminate material allowing greater design flexibility in PCB fabrication over standard laminate material, which complies with more stringent mechanical and electrical specifications to improve signal quality, and where such compliance is repeatable for multiple PCBs.

SUMMARY OF THE INVENTION

An embedded core laminate according to the present invention includes a conductive embedded reference layer interposed between two insulation layers, which are further interposed between two conductive layers, where all layers are then laminated together. The conductive layers comprise copper sheets or any other desirable conductive material such as CIC (copper-invar-copper) or copper-molybdenum. The embedded reference layer is first punched out or drilled with holes to achieve the appropriate clearances for signal interconnect vias. The holes are either spaced apart according to a standard grid, such as 50 mils (milli-inches), 100 mils, or 150 mils, or the holes are drilled according to power and ground plane ECAD (engineering computer aided design) data from the design engineers. Preferably, the punched out reference layer is placed between two insulating layers made of dielectric material suitable for PCB fabrication. Preferably, the insulating layers comprise sheets of high resin FR-4 or 1060 material or other fiberglass material impregnated with resin or epoxy. The reference and insulating layers are also interposed between two conductive layers, which are preferably sheets of copper foil. The resulting structure is then laminated using standard processes known to those skilled in the art. Preferably, heat is applied to the structure while it is pressed together between rollers. During the lamination process, the resin flows to fill up the punched out cavities in the reference layer.

An embedded core laminate according to the present invention includes an additional layer having a tighter tolerance of thickness variation as compared to a PCB made from standard laminate, thus providing for improved impedance control. Characteristic impedance variation on signal layers adjacent the embedded reference layer are reduced because of improved separation uniformity. The uniform separation is maintained from one PCB to the next using embedded core laminate according to the present invention, thereby minimizing cross-talk and characteristic impedance variations from one PCB to the next.

The embedded reference layer is made of any desirable conductive material, such as copper, CIC, copper-molybdenum, or the like, so that the CTE of the PCB is tailored to match the semiconductor dies to be mounted on the PCB, if desired. This allows increased reliability by protecting solder joints of conventional SMT devices from thermal stress. Additionally, matching CTE parameters allows for the use of advanced DCA methods, which traditionally have required more exotic dielectric materials.

From a standpoint of PCB fabrication, an embedded core laminate according to the present invention allows increased design flexibility. The present invention allows for a five-layer board with three signal layers to be fabricated in a similar manner as a conventional four-layer board. Likewise, a seven-layer board is fabricated similar to a conventional 8-layer board, and so on. Thus, a designer requiring more than four layers is not automatically forced to use six layers, but may use five layers instead reducing the amount of material required. In general, a designer need add only one layer rather than two by switching to an embedded core laminate according to the present invention. This results in cost savings. If a five layer board is desired, the embedded core laminate according to the present invention allows the power and ground planes and a signal layer to be implemented on the laminate, thereby minimizing common mode noise. This reduces EMI (electromagnetic interference) noise generated by the PCB. Thus, an embedded core laminate according to the present invention allows improved performance and increased design flexibility over the standard two-layer laminate widely used today.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1A:
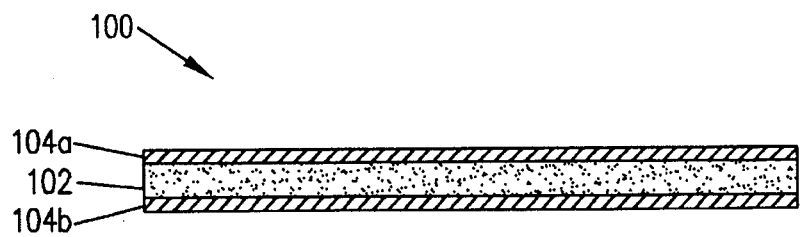
FIG. 1A is a standard two layer laminate material according to prior art.

Referring now to FIG. 1A, a standard laminate material 100 according to prior art is shown. The laminate material 100 includes a central insulating layer 102, which typically comprises a prepreg material made of a fiberglass sheet impregnated with epoxy resin. The insulation layer 102 may also be made of other dielectric materials, including polyimide, cynate, Kevlar, Teflon, etc. The insulation layer 102 is interposed between two conductive layers 104a, 104b which usually comprise a certain weight of copper foil, such as 1 oz. (ounce), 2 oz. or more copper foil. The epoxy of the insulating layer 102 forms a chemical bond with the metal of the conductive layers 104a, 104b during a standard laminating procedure. The insulating layer 102 electrically isolates the conductive layers 104a, 104b, and also provides structural strength for the laminate material 100 for mounting components.

Figure 1B:
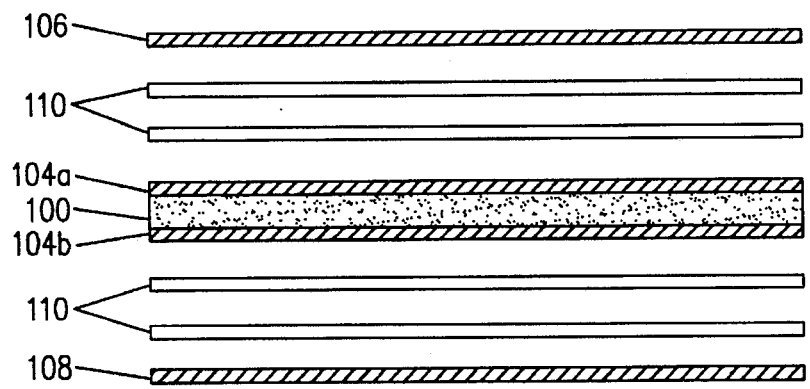
FIGS. 1B and 1C illustrate alternative structures of four layer PCBs using the standard laminate material of FIG. 1A.
Figure 1C:
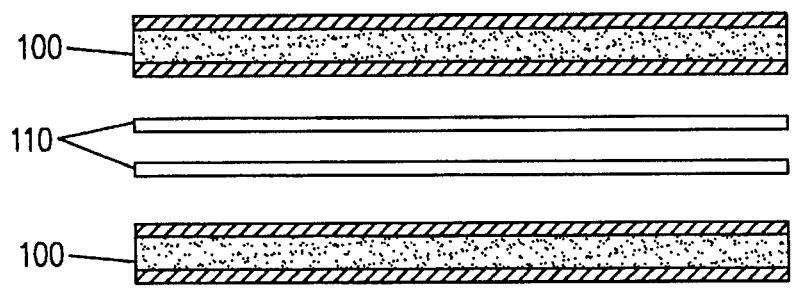

FIGS. 1B and 1C show possible structures of a four layer PCB using the laminate material 100 of FIG. 1A. The embodiment shown in FIG. 1C is not very common since two separate laminates 100 for a single PCB is relatively expensive. Additional layers 106 and 108 shown in FIG. 1B are usually laminated to the laminate material 100 using prepreg material 110. Because of the laminating procedure, the conductive layers 104a and 104b may be pressed relatively close together. Nonetheless, the additional layers 106 and 108 are added with a different process resulting in wide thickness variations.

Figure 2A:
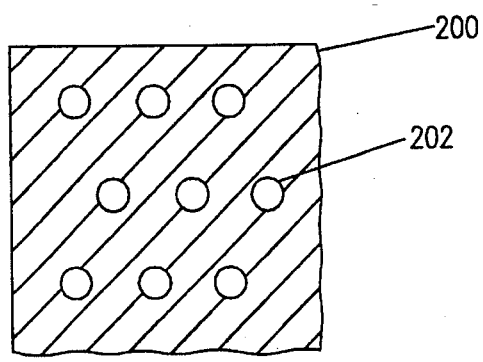
FIGS. 2A, 2B, and 2C are partial views illustrating the construction of an embedded core laminate according to the present invention.

Referring now to FIG. 2A, a partial top view of a conductive reference layer 200 is shown including punched out or drilled holes 202. The reference layer 200 preferably comprises a sheet of conductive material, such as a sheet of 1 oz. copper, or other conductive materials such as CIC or copper-molybdenum. As will be described more fully below, the choice of the material for the reference plane 200 may depend on its coefficient of thermal expansion (CTE) compared to the CTE of semiconductor dies be mounted on a printed circuit board (PCB) made with the embedded core laminate 208 (FIG. 2C). Such CTE matching is desirable, but is not required for purposes of the present invention.

The clearances holes 202 are any desired size for allowing signal interconnect vias as known to those skilled in the art. The clearances holes 202 are either spaced according to a standard grid, or the location and spacing of the clearances holes 202 are defined by design engineers. For example, the clearances holes 202 could be punched out or drilled on a 50 milli-inch (mil, 100 mil, 150 mil, etc. grid depending upon the circuit design. Alternatively, power and ground plane ECAD (engineering computer aided design) data could be provided on a storage media such as diskette or tape, which is provided to a computer-controlled drilling machine (not shown) for drilling the clearances holes 202. The ECAD data includes the appropriate drill data that tells the drilling machine the location and size of each of the clearances holes 202 in the reference plane 200.

Figure 2B:
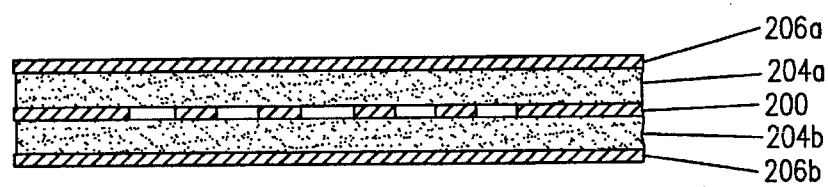
Figure 2C:
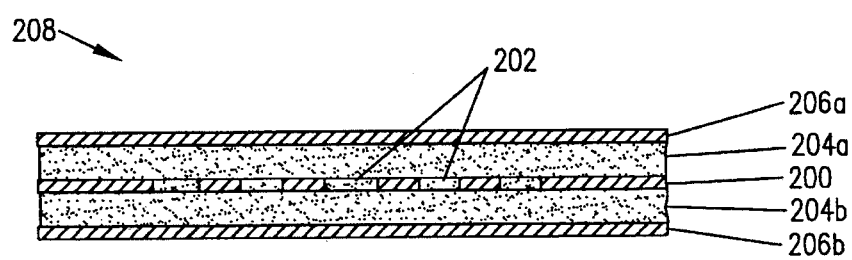

Referring now to FIG. 2B, a partial side view is shown of the reference layer 200 interposed between two insulating layers 204a, 204b, which are further interposed between two conductive layers 206a, 206b. Each of the insulating layers 204a, 204b are preferably made of suitable dielectric material such as fiberglass, and a material for bonding to the conductive layers 200, 206a and 206b such as resin. Preferably, the insulating layers 204a, 204b comprise fiberglass sheets impregnated with epoxy, such as high resin FR-4 or 1060 material, although other dielectric materials may be used, including polyimide, cognate, Kevlar, Teflon, etc. The conductive layers 206a, 206b are preferably sheets of copper foil or other conductive material including CIC, copper-molybdenum or the like, having a desired weight, such as 1 or 2 oz., for example. The particular material and weight or thickness of the conductive layers 206a, 206b is a matter of design choice and not intended to limit the present invention.

The conductive and insulating layers illustrated in FIG. 2B are then laminated together according to standard processes known to those skilled in the art. A partial side view of a resulting embedded core laminate 208 is shown in FIG. 2C. Preferably, the assembled components are pressed together with steel rollers while heat is applied as known to those skilled in the art. During the laminate process, epoxy flows to fill the clearances holes 202 in the reference layer 200. The resulting embedded core laminate 208 is then inspected and tested. It is understood that the placement of the reference layer 200, the insulating layers 204a, 204b and the conductive layers 206a, 206b need not be performed in any particular order, as long as the resulting structure is ordered as shown in FIG. 2B.

The embedded core laminate 208 shown in FIG. 2C provides a very tight tolerance separation between the reference plane 200 and the conductive layers 206a, 206b. For example, an embedded core laminate 208 could be specified to have a layer separation tolerance of 5+/−0.1 mils, which is very difficult and usually not attempted with layers added to the standard laminate material 100. Also, the insulating layers 204a, 204b are preferably thinner than the insulating layer 102, since there are two separate layers providing structural strength. During the laminate process, strength is enhanced since the epoxy or resin flows into the clearances 202 of the embedded reference plane 200. Thus, the insulating layers 204a, 204b are essentially bonded together through the reference layer 200.

The embedded reference layer 200 of the embedded core laminate 208 provides the obvious advantage of an additional layer for signal, power or ground. Since all three layers are laminated together, they are all spaced apart in a very uniform manner, with relatively minimal thickness variations across the length of the embedded core laminate 208. Because of this thickness uniformity, the mechanical, and therefore the electrical characteristics of the signals etched on the layers 206a and 206b are superior over that of prior art. In particular, the uniform thickness substantially minimizes characteristic impedance variations of signal traces on the layers 206a, 206b, due to relatively uniform proximity to the reference layer 200. Additionally, this uniform layer separation is maintained from one PCB to the next. In this manner, several boards using the embedded core laminate 208 have minimum impedance and cross-talk variations from one PCB to the next.

The selection of the material of the reference plane 200, as well as the copper layers 206a and 206b are preferably chosen with the same or similar CTE to match that of the die of semiconductor chips mounted on the resulting PCB. For example, the layers 200, 206a, and 206b are made of copper, CIC, copper-molybdenum, or the like, depending upon the CTE of the semiconductor die to be mounted. This provides increased protection of solder joints of conventional surface mount technology (SMT) devices from thermal stress, resulting in increased reliability. Furthermore, the CTE of the dies of the chips are matched as desired to allow for the use of advanced direct chip attach (DCA) methods, which have traditionally not been attempted on standard PCBs using prior art laminates.

Figure 3:
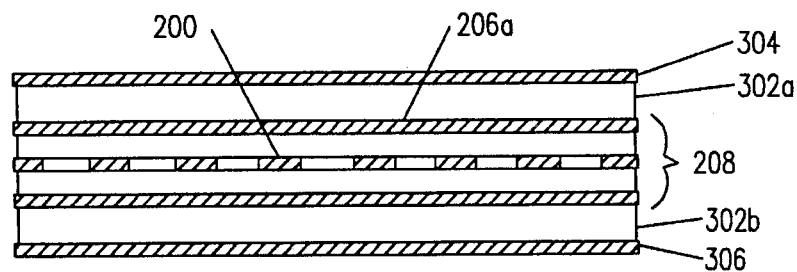
FIG. 3 is a five-layer board using the embedded core laminate of FIG. 2C.

The embedded core laminate 208 allows for increased design flexibility from the standpoint of PCB fabrication. If a designer using the embedded core laminate 208 requires more layers to implement a particular design, a multilayer board (MLB) can be fabricated by further interposing the embedded core laminate 208 between additional layers. In FIG. 3, the embedded core laminate 208 is interposed between insulating layers 302a and 302b, which are further interposed between conductive layers 304 and 306 in a similar manner as shown in FIG. 1B, to achieve a five layer PCB 300. Again, the insulating layers 302a, 302b and the conductive layers 304, 306 may comprise similar materials as described previously for the insulating layers 204a, 204b and the conductive layers 206a, 206b, respectively. It is understood that additional layers may be added to the five layer PCB 300 to achieve an MLB with seven layers, nine layers, and so on.

In this manner, if a four-layer board with two routing layers using the standard laminate material 100 of prior art is insufficient due to routing density, the designer could use the five-layer PCB 300 shown in FIG. 3 rather than using a six layer board, resulting in substantial savings. PCB fabrication costs are reduced since the five-layer PCB 300 is fabricated in a very similar manner as the four-layer PCB of prior art shown in FIG. 1B. This is so because the embedded core laminate 208 is interposed between two additional layers just like a four-layer board using the standard laminate 100 of prior art, rather than four additional layers required for a six layer PCB. It has been determined that the reduction in fabrication cost more than offsets the possible increased price of the embedded core laminate 208. The same reasoning is applicable for a designer requiring more than 6 layers, but not necessarily eight layers, since the embedded core laminate 208 allows seven layers, nine layers, and so on.

The five-layer PCB 300 including the embedded core laminate 208 is also superior from an EMI (electromagnetic interference) standpoint due to the proximity of the various layers over MLBs of prior art. In particular, suppose the reference plane 200 is made into a ground (GND) plane, layer 206a is made a signal layer S2, layer 206b is made a power (PWR) plane, layer 304 is made another signal plane S1 and layer 306 is made another signal layer S3. Conrotan mode noise is substantially reduced because of the proximity between the GND and PWR planes and the signal integrity of the signal layer S2 is improved because of its proximity to the GND plane.

Figure 4:
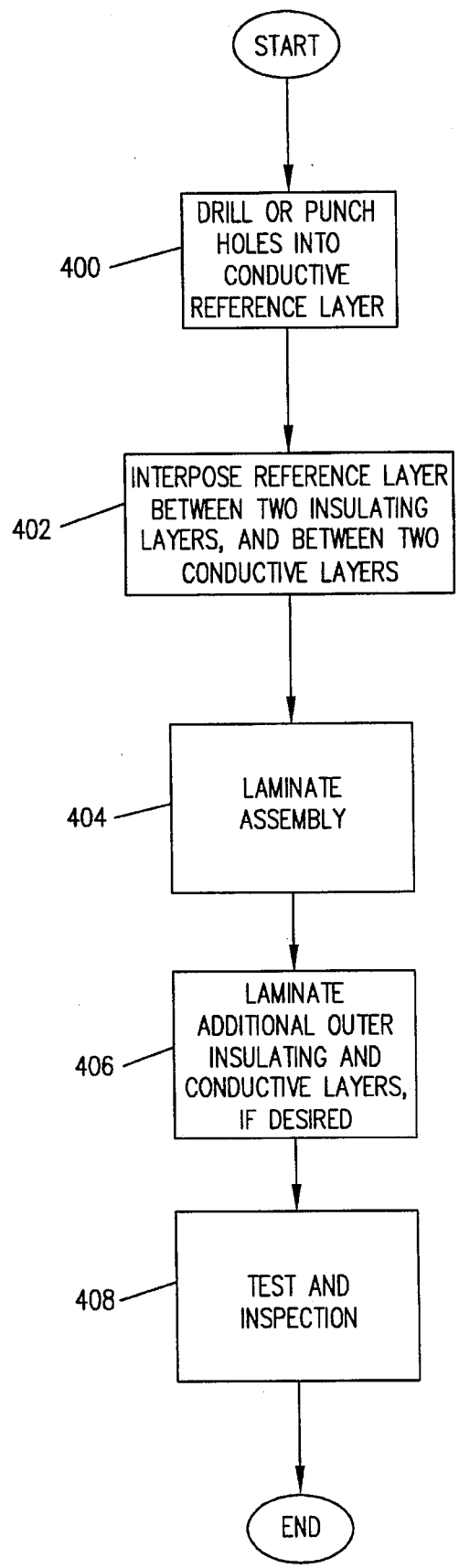
FIG. 4 is a flowchart diagram illustrating the procedure used to fabricate the embedded core laminate of FIG. 2C and additional layers if desired.

FIG. 4 is a flowchart diagram illustrating the procedure outlined above for fabricating the embedded core laminate 208 and the 4-layer PCB 300. Again, the vias 202 are drilled or punched into the conductive reference layer 200 in a step 400, and then the reference layer 200 is interposed between two insulating layers 204a, 204b and between two conductive layers 206a, 206b in a step 402. The assembly is laminated together in a step 404. If additional layers are desired, a step 406 is performed to add more insulating and conductive layers. The resulting PCB may be tested and inspected as desired as shown in a step 408.

It is now appreciated that an embedded core laminate according to the present invention provides an additional conductive layer to improve electrical signal characteristics and design flexibility. The three layers of an embedded core laminate are separated in a uniform manner with relatively small variance, providing tighter impedance control of each PCB and minimizing cross-talk and characteristic impedance variations from one PCB to the next. A designer requiring more than four layers can use a five layer board rather than being forced to a six layer board, which was not feasible using standard laminate material of prior art. Likewise, seven layers are allowed rather than requiring eight layers, and so on. Thus, an embedded core laminate according to the present invention improves signal integrity and provides greater design flexibility over standard laminate material.

Although the method and apparatus of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

I claim:

1. An embedded core laminate, comprising:
   a first and a second conductive layer;
   a first and a second insulating layer interposed between said first and second conductive layers; and
   a conductive reference layer interposed between said first and second insulating layers, wherein said conductive reference layer includes a plurality of holes;
   wherein said first and second conductive layers, said conductive reference layer and said first and second insulating layers are laminated together, so that said conductive reference layer is the center layer of the embedded core laminate.

2. The embedded core laminate of claim 1, wherein said first and second conductive layers, said conductive reference layer and said first and second insulating layers are all aligned substantially parallel to each other.

3. The embedded core laminate of claim 1, wherein said first and second conductive layers and said conductive reference layer comprise sheets of copper foil.

4. The embedded core laminate of claim 1, wherein said first and second conductive layers and said conductive reference layer comprise sheets of copper-invar-copper material.

5. The embedded core laminate of claim 1, wherein said first and second conductive layers and said conductive reference layer comprise sheets of copper-molybdenum material.

6. The embedded core laminate of claim 1, wherein said first and second insulating layers comprise fiberglass impregnated with resin.

7. The embedded core laminate of claim 6, wherein said resin is epoxy.

8. The embedded core laminate of claim 1, wherein said first and second insulating layers comprise a dielectric material impregnated with resin.

9. The embedded core laminate of claim 1, wherein said plurality of holes in said conductive reference layer provide clearances for interconnect vias.

10. The embedded core laminate of claim 1, wherein said first and second conductive layers, said conductive reference layer and said first and second insulating layers are laminated together using pressure.

11. The embedded core laminate of claim 1, further comprising:
    a fourth and a fifth conductive layer; and
    a third and a fourth insulating layer, wherein said third and fourth insulating layers are interposed between said fourth and fifth conductive layers, wherein said embedded core laminate is interposed between said third and fourth insulating layers, and wherein said third and fourth insulating layers and said fourth and fifth conductive layers are laminated to said embedded core laminate.

12. A printed circuit board, comprising:
    an embedded core laminate, comprising:
    a first and a second conductive layer;
    a first and a second insulating layer interposed between said first and second conductive layers; and
    a conductive reference layer interposed between said first and second insulating layers, wherein said conductive reference layer includes a plurality of holes, and wherein said first and second conductive layers, said conductive reference layer and said first and second insulating layers are laminated together, so that said conductive reference layer is the center layer of said embedded core laminate;
    a fourth and a fifth conductive layer; and
    a third and a fourth insulating layer, wherein said third and fourth insulating layers are interposed between said fourth and fifth conductive layers, wherein said embedded core laminate is interposed between said third and fourth insulating layers, and wherein said third and fourth insulating layers and said fourth and fifth conductive layers are laminated to said embedded core laminate.

13. The printed circuit board of claim 12, wherein said plurality of holes in said conductive reference layer provide clearances for interconnect vias.

14. The printed circuit board of claim 12, wherein said first and second conductive layers, said conductive reference layer and said first and second insulating layers are laminated together using pressure.

* * * * *